(12) United States Patent
Tauber et al.

(10) Patent No.: US 8,654,001 B2
(45) Date of Patent: Feb. 18, 2014

(54) WIDE-BAND HIRF DETECTOR- AND ANALYSIS SYSTEM FOR AIRCRAFT

(75) Inventors: Wolfgang Tauber, Bruckmuhl (DE); Wolfgang Kreitmair-Steck, Ottobrunn (DE); Bernd Wolff, Gotting/Bruckmuhl (DE)

(73) Assignee: Eurocopter Deutschland GmbH, Donauwoerth (DE)

( * ) Notice: Subject to any disclaimer, the term of this patent is extended or adjusted under 35 U.S.C. 154(b) by 187 days.

(21) Appl. No.: 13/201,653

(22) PCT Filed: Feb. 4, 2010

(86) PCT No.: PCT/IB2010/000219
§ 371 (c)(1),
(2), (4) Date: Aug. 16, 2011

(87) PCT Pub. No.: WO2010/112989
PCT Pub. Date: Oct. 7, 2010

(65) Prior Publication Data
US 2012/0032832 A1 Feb. 9, 2012

(30) Foreign Application Priority Data
Mar. 31, 2009 (EP) .................................... 09400011

(51) Int. Cl.
*G01S 7/40* (2006.01)
(52) U.S. Cl.
USPC .......................................... 342/13; 342/192
(58) Field of Classification Search
USPC ............................................ 342/13–19, 192
See application file for complete search history.

(56) References Cited

U.S. PATENT DOCUMENTS

| 4,277,744 A | * | 7/1981 | Audone et al. ................... 324/72 |
| 4,405,926 A | * | 9/1983 | Potter ........................... 342/455 |
| 4,833,476 A | * | 5/1989 | Dutcher ......................... 342/351 |
| 5,252,912 A | * | 10/1993 | Merritt et al. ..................... 324/72 |
| 5,859,597 A | * | 1/1999 | Cornelio et al. ................ 340/946 |
| 6,002,348 A | * | 12/1999 | Greene et al. ................... 340/963 |
| 6,639,541 B1 | | 10/2003 | Quintana |
| 6,738,012 B1 | * | 5/2004 | Kirkpatrick ...................... 342/67 |
| 6,872,960 B2 | * | 3/2005 | Pepper et al. ............... 250/495.1 |

(Continued)

FOREIGN PATENT DOCUMENTS

FR 2891627 A1 4/2007

OTHER PUBLICATIONS

Robert T. Johnk, RF Electromagnetic Penetration of the NASA Space Shuttle Endeavour performed with an Ultra-Wideband System.

(Continued)

*Primary Examiner* — John B Sotomayor
(74) *Attorney, Agent, or Firm* — Brooks Kushman P.C.

(57) ABSTRACT

A method for detecting electromagnetic threats to an aircraft, wherein electromagnetic fields are measured, and in the case of an arising threat to the aircraft being detected, countermeasures are taken, characterized by the following steps: measuring the frequency and the amplitude of at least one electromagnetic field in the frequency range from 9 KHz to 40 GHz; analyzing the measured results and determining the field intensity in relation to each measured frequency; comparing the field intensity in relation to each measured frequency with stored limiting values or qualification values, wherein the aircraft is qualified for field intensities that are lower than the limiting values; and providing the result in the form of a warning signal in the case of approaching or exceeding a limiting value.

11 Claims, 2 Drawing Sheets

(56) References Cited

U.S. PATENT DOCUMENTS

| | | |
|---|---|---|
| 7,218,123 B1 | 5/2007 | Tsamis |
| 2002/0153497 A1* | 10/2002 | Pepper et al. ............. 250/495.1 |
| 2004/0257064 A1 | 12/2004 | Ito |
| 2012/0032832 A1* | 2/2012 | Tauber et al. ................ 342/14 |

OTHER PUBLICATIONS

Robert T. Johnk, RF Electromagnetic Penetration of the NASA Space Shuttle Endeavour performed with an Ultra-Wideband System. Electromagnetic Capability. XP31136252. Jul. 7, 2007, pp. 1-6. ISBN: 978-1-4244-1349-2.

* cited by examiner

WIDE-BAND HIRF DETECTOR- AND ANALYSIS SYSTEM FOR AIRCRAFT

CROSS REFERENCE TO RELATED APPLICATION

This application is the U.S. national phase of PCT application no. PCT/IB2010/000219 filed Feb. 4, 2010 which claims priority to European application 09 400011.4 filed Mar. 31, 2009.

BACKGROUND OF THE INVENTION

1. Technical Field

The present invention relates to the technical field of registering and/or detecting electromagnetic fields in aircraft.

When aircraft fly into electromagnetic fields for which their systems have not been qualified, the behaviour of these systems is unforeseeable. This is the case whenever aircraft approach powerful transmitters more closely than intended, or when they are intentionally subjected to such field intensities in the context of a military or terrorist threat scenario.

By means of an onboard sensor system which measures the field intensities that are present at the time and compares them with field intensities that have been deemed safe in the certification process, it becomes possible to overcome such restrictions in the use of the aircraft or to achieve additional safety for the aircraft.

2. Description of Related Art

From the printed publication U.S. Pat. No. 7,218,123, it is, for example, known to register an electromagnetic threat in a limited frequency range. The system described uses a capacitive sensor with a protected amplifier unit. This sensor is only intended to detect electromagnetic processes, for example electromagnetic fields of antenna or lightning strikes.

Such a system is associated with disadvantages when used in aircraft, in particular in helicopters, in that the air crew does not know what electromagnetic environment they are operating in, in that mobile transmitters cannot be taken into account; in that in the case of military/terrorist attacks the aircrew cannot detect that they are threatened by electromagnetic weapons, e.g. high-power microwave weapons; and in that it is not possible to furnish proof of any problems due to electromagnetic radiation but that such problems can at best only be suspected.

Any registration by such a system is thus in no way adequate to furnish to the crew of the aircraft more detailed information about a threat.

SUMMARY OF THE INVENTION

It is the object of the invention to be able to provide the crew of an aircraft in flight mode with analysed and detailed electromagnetic radiation information that is immediately evaluated to ensure the safety of the aircraft.

It is an additional object of the invention to be able to provide analysed and detailed electromagnetic radiation information that can be evaluated even after completion of the aircraft's mission.

These objects are met by a method for detecting electromagnetic threats to an aircraft, wherein electromagnetic fields are measured and, if an arising threat to the aircraft is detected, countermeasures are taken, characterised by the following steps:

measuring the frequency and the amplitude of at least one electromagnetic field in the frequency range from 9 KHz to 40 GHz;

analysing the measured results and determining the field intensity in relation to each measured frequency;

comparing the field intensity in relation to each measured frequency with stored limiting values or qualification values, wherein the aircraft is qualified for field intensities that are lower than the limiting values; and providing the result of the comparison in the form of a warning signal in the case of approaching or exceeding one of the limiting values.

According to one exemplary embodiment of the method according to the invention, the safety distance to the field intensities to which the aircraft and its electric/electronic systems have been qualified is determined.

According to one exemplary embodiment of the method according to the invention, the directions of the electromagnetic fields/radiation are detected.

According to one exemplary embodiment of the method according to the invention, for receiving, a single antenna is used, at least for the entire frequency range from 9 KHz to 20 GHz.

According to one exemplary embodiment of the method according to the invention, the field intensity that is present at the time and that has been measured is displayed or indicated in comparison to the limiting values of the aircraft.

According to one exemplary embodiment of the method according to the invention, in the case of field intensities approaching or exceeding the limiting values, a warning of an acoustic and/or visual type takes place.

According to one exemplary embodiment of the method according to the invention, by means of the field intensities measured an electromagnetic map of a specified region is drawn or electronically stored.

According to one exemplary embodiment of the method according to the invention, an HIRF (high-intensity radiated field) processor with a specially developed spectral analyser is used.

These objects are met by a device comprising a sensor system to determine electromagnetic threats to an aircraft, with means for measuring electromagnetic fields and means for analysing and evaluating the measured data or an HIRF detector and an analysis system, characterised in that the sensor system, by means of at least one antenna that has been externally affixed to the aircraft, records the frequency and the amplitude; in that reworking means for computing, comparing and for determining the field intensity of each measured frequency are provided; and in that an electronic storage device comprises field intensity limiting values or field intensity qualification values for comparison with the determined field intensity, wherein means for providing a warning signal in the case of approaching or exceeding one of the field-intensity limiting values are provided.

In a further embodiment of the invention it has been shown to be advantageous if for detection of the direction of the electromagnetic radiation at least two antennae or field-intensity measuring sensors that are separate from each other are used.

In a further embodiment of the invention it has been shown to be advantageous if it comprises at least two or three antennae of the same type, which are affixed to different installation locations of the platform of the aircraft.

In a further embodiment of the invention it has been shown to be advantageous if it comprises means for electronically recording or storing geo-referenced field-intensity mapping.

In a further embodiment of the invention it has been shown to be advantageous if it comprises a display device for showing the relevant electromagnetic field information.

Furthermore, it is advantageous if the HIRF detector and the analysis system are designed as a stand-alone system with a direct acoustic and/or visual display. The reworking means can, for example, also form part of the stand-alone system.

Another advantage of the method according to the invention is that the influences of the electromagnetic field waves on the inner systems of the aircraft are detected prior a potential disturbing effect.

The objects of the invention are also met by a helicopter in which a device according to the invention is installed.

According to the invention the safety of the aircraft is improved because a warning is issued when it flies into hazardous electromagnetic fields. The pilots are thus always informed as to the electromagnetic environment in which they move, and can move in unknown regions without having knowledge about existing fixed or mobile transmitters. Pilots do not have to pay additional attention to this issue because any increased electromagnetic field intensity automatically leads to an acoustic warning and/or is visually displayed.

It is advantageous if prior to operation of the aircraft the operating region does not first have to be checked for the presence of possibly critical transmitters. The pilots are at all times warned of any military or terrorist attacks involving electromagnetic weapons.

Electromagnetic attacks, for example from the ground, can be detected, and evasive procedures can be initiated in good time.

There is a further advantage in that a system comprising a device according to the invention can also be used for preparing an HIRF map of unknown regions by systematically scanning the regions.

There is a further advantage according to the invention in that any speculation relating to strong electromagnetic fields as possible sources of an accident, during investigation of the accident, can objectively be confirmed or refuted.

BRIEF DESCRIPTION OF THE DRAWINGS

Further advantages, characteristics and details of the invention are set out in the following description of a preferred exemplary embodiment as well as with reference to the drawings, which show the following.

DESCRIPTION OF THE PREFERRED EMBODIMENTS

Figure 1:
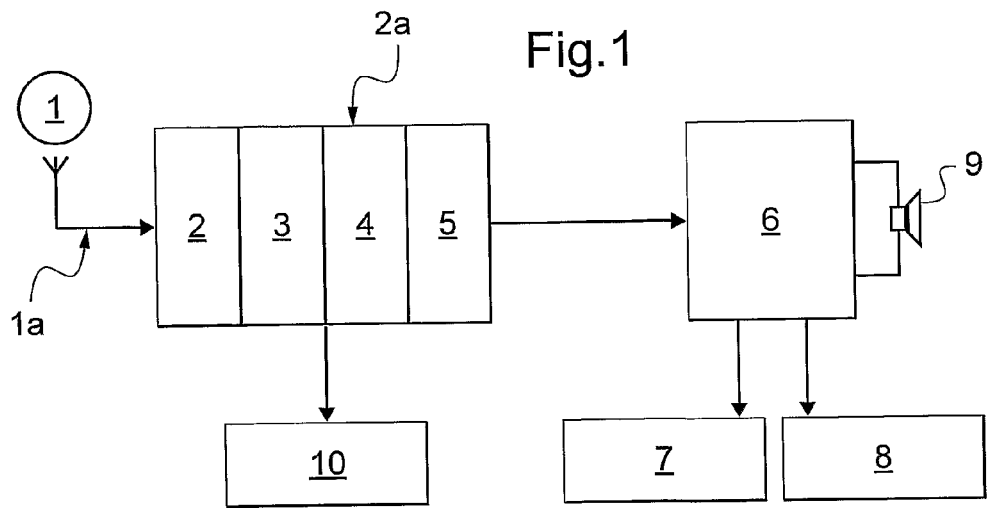
FIG. 1, a diagrammatic view of a sensor architecture, in particular a device with a wide-band antenna, according to the invention.

The basic principle of the invention is, for example, illustrated in FIG. 1. The device according to the invention comprises a wide-band receiving antenna 1 or field intensity sensor, which in the frequency range from 9 KHz to 40 GHz measures the actual electromagnetic fields. The wide-band receiving antenna 1 measures an HR signal and transmits it to a receiver/spectrum analyser 2 by way of a connecting line 1a.

The connected receiver/spectrum analyser 2 then furnishes the required parameters, frequency and amplitude. This information is transmitted in analogue or digitalised form to a comparator 3 that compares the measured or computed field intensities with the limiting values predetermined at the detected frequency (maximum field intensities) of the respective platform.

The limiting values are, for example, stored in a limiting-value curve storage device 4.

When the predetermined limiting values are approached or exceeded, a warning signal is generated by means of a control unit 5 that is connected to a management computer 6. The management computer 6 in turn controls a visual warning display 7, a display 8 and/or an acoustic warning display 9.

The receiver/spectrum analyser 2, the comparator 3, the storage device 4 and the control unit 5 are for example integrated in a HIRF processor 2a or form a part of a HIRF processor 2a.

The warning signal is, for example, a display of field intensity and frequency on the display 8, illumination of a warning light, and/or an acoustic signal on a head receiver.

In one embodiment of the invention the analysis results or any exceeding of the limiting values can be forwarded to a flight data recorder 10 and can be stored.

Figure 2:
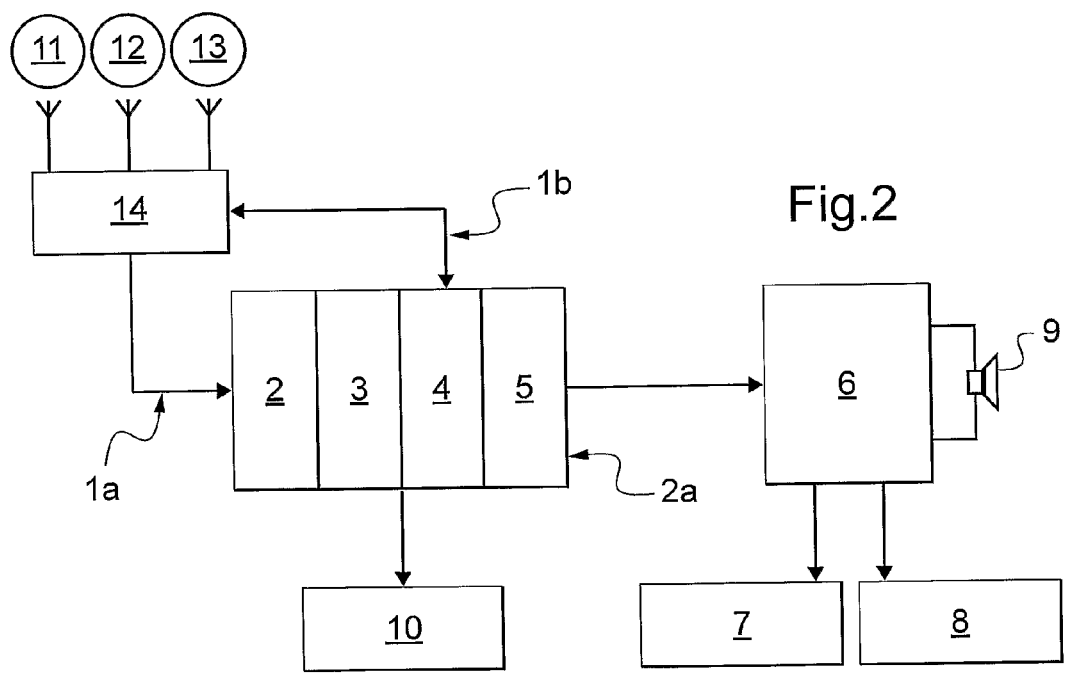
FIG. 2, a diagrammatic view of a sensor architecture, in particular with a device comprising three wide-band antennae for determining the direction, according to the invention.

The design of FIG. 2 differs from that in FIG. 1 insofar as several wide-band receiving antennae 11, 12, 13 are installed on the aircraft. The wide-band receiving antennae 11, 12, 13 measure an HR signal and transmit it to the receiver/spectrum analyser 2 by way of the connecting line 1a.

By means of a second connecting line 1b and a switch 14 that is connected to the wide-band receiving antennae 11, 12, 13, the control unit 5 can activate one of the wide-band receiving antennae 11, 12, 13, one after another.

If several wide-band antennae 11, 12, 13 are installed, by corresponding evaluation of the measuring results, the information of the direction from which the radiation emanates, or the distance of interference resistance of the aircraft can be displayed as further parameters.

HIRFs involve very high field intensities that are to be detected. Consequently there is no demanding requirement relating to the sensitivity of the antennae 1, 11, 12, 13. Calculations of the field coupling to a dipole antenna (for example 5 cm in length and 5 mm in thickness) show that such an antenna is quite sufficient for measuring field intensities around 10 V/m between 9 KHz and 20 GHz. With the use of particular dipole designs, improvements relating to the bandwidth and the signal quality are possible.

Measuring can take place by an antenna system in which two dipoles are arranged so as to be perpendicular to each other. Furthermore, dipole antennae with inbuilt components, for example a coil, for frequency-dependent variation of the antenna length are possible variants within the scope of the invention.

Figure 3:
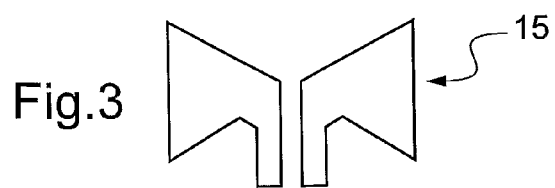
FIG. 3, an example of a <<bow tie>> antenna of the device according to the invention.
Figure 4:
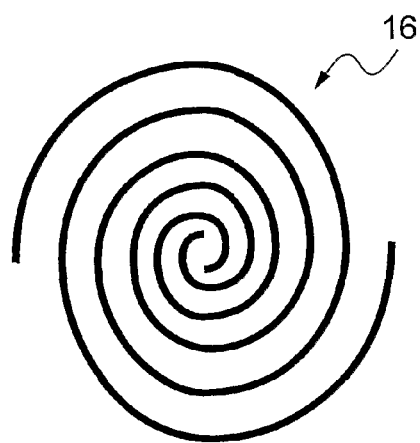
FIG. 4, an example of a logarithmic spiral antenna of the device according to the invention.
Figure 5:
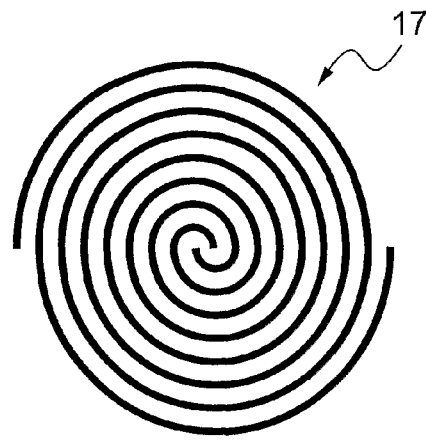
FIG. 5, an example of an arithmetic antenna of the device according to the invention.

Optimisation of the system can be achieved by special wide-band dipole designs, for example "bow tie" antennae 15 as shown in FIG. 3, or variants of arithmetic 17 or logarithmic spiral antennae 16, as shown in FIG. 5 and in FIG. 4.

In order to determine the direction of radiation, it is proposed that two or several antennae be affixed in different positions. Possible installation locations include, for example, forward in the direction of flight, as well as on the right-hand side and on the left-hand side of the aircraft. In order to avoid the expenditure of providing two or several receivers/spectrum analysers 2, upstream of the receiver input the computer-controlled switch 14 is installed, which switches between the antennae 11, 12, 13 and reads out the antenna measuring results one after another.

Realisation of the antennae 1, 11, 12, 13 can, for example, take place in stripline technology.

During operation, depending on the frequency and the field intensity that is present at a given time, an electrical voltage occurs at an antenna base, which voltage is read by means of a receiver or spectrum analyser 2. By means of a single spectrum analyser 2, at least the measuring range from 9 KHz to 20 GHz can be covered. A sole or two spectrum analysers 2 can be provided according to the invention.

For example the HIRF limiting value curves for which the aircraft is certified have been entered and stored in the HIRF processor 2a.

The signal data supplied by the receiver/spectrum analyser 2 are processed in the HIRF processor 2a, and by means of the comparator 3 are compared to the stored limiting values. Depending on the result of the comparison, in the case of a limiting value being approached or exceeded a warning signal is emitted or transmitted to the management computer 6 (onboard computer).

If the management computer 6 receives a warning signal, it can generate an acoustic alarm, a display in the form of a blinking light on a warning panel, and/or display warning information on the display 8, if applicable with further details relating to the threat (e.g. direction and criticality of the threat).

The various data can sensibly be transmitted to a data recording device, for example to the flight data recorder 10, for storage.

In one embodiment the HIRF processor 2a can be designed in such a way that it transmits the warning signals directly to the warning panel and to an audio system, or that said HIRF processor 2a itself carries out the acoustic/visual warning function.

Figure 6A:
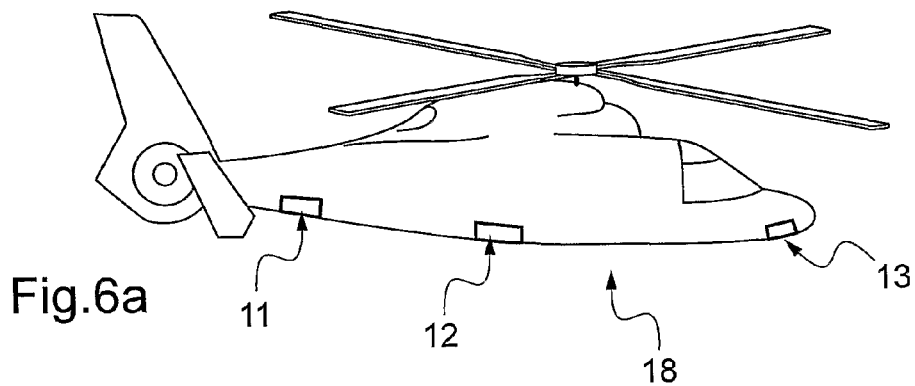
FIG. 6a and FIG. 6b, an aircraft, for example a helicopter, in two exemplary constructions, comprising a device according to the invention.
Figure 6B:
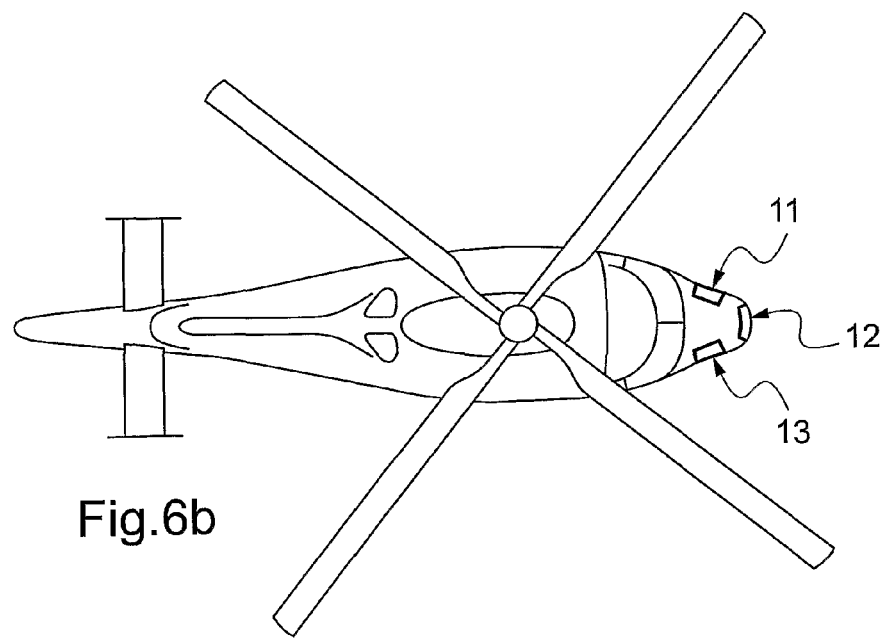

FIG. 6a and FIG. 6b show a helicopter 18 in which the device according to the invention is installed, and in which the method according to the invention is implemented by means of three wide-band receiving antennae 11, 12, 13 affixed to the platform.

Of course, within the scope of the invention it is possible to provide still further embodiment options. The invention also covers variants of technical characteristics and method-related steps that are not described in detail but that suggest themselves to the average person skilled in the art.

The invention claimed is:

1. A method for detecting electromagnetic threats to a helicopter during an in-flight mode of the helicopter, wherein the helicopter is qualified for in-flight electromagnetic intensity qualification values, the method comprising:
   detecting at least one electromagnetic field external to the helicopter, in a frequency range from 9 KHz to 40 GHz, and in a frequency bandwidth of substantially 40 GHz corresponding to the frequency range using at least one antenna externally affixed to the helicopter;
   measuring frequency and amplitude of the at least one electromagnetic field and analysing the measured results and determining a field intensity in relation to each measured frequency using a high-intensity radiated field (HIRF) processor on-board the helicopter and in communication with the at least one antenna;
   comparing the field intensity in relation to each measured frequency with stored electromagnetic intensity limiting values using the HIRF processor, wherein the limiting values are lower than the qualification values; and
   providing the result of the comparison from the HIRF processor in the form of a warning signal in the case of the field intensities approaching or exceeding one of the limiting values.

2. The method according to claim 1, further comprising detecting direction of the at least one electromagnetic field.

3. The method according to claim 1, wherein a single antenna is used for detecting the at least one electromagnetic field, in at least the entire frequency range from 9 KHz to 20 GHz.

4. The method according to claim 1, further comprising displaying or indicating the field intensity in relation to each measured frequency in comparison to the limiting values of the helicopter.

5. The method according to claim 1, wherein the case of the field intensities approaching or exceeding the limiting values, a warning of an acoustic and/or visual type takes place.

6. The method according to claim 1, further comprising drawing an electromagnetic map of a specified region based on the field intensity in relation to each measured frequency.

7. A sensor system for detecting electromagnetic threats to a helicopter during an in-flight mode of the helicopter, wherein the helicopter is qualified for in-flight electromagnetic intensity qualification values, the system comprising:
   at least one antenna externally affixed to the helicopter for detecting at least one electromagnetic field external to the helicopter, in a frequency range from 9 KHz to 40 GHz, and in a frequency bandwidth of substantially 40 GHz corresponding to the frequency range; and
   a high-intensity radiated field (HIRF) processor on-board the helicopter and in communication with the at least one antenna for measuring frequency and amplitude of the at least one electromagnetic field and analysing the measured results and determining a field intensity in relation to each measured frequency, for comparing the field intensity in relation to each measured frequency with stored electromagnetic intensity limiting values using the HIRF processor, wherein the limiting values are lower than the qualification values, and for providing the result of the comparison in the form of a warning signal in the case of the field intensities approaching or exceeding one of the limiting values.

8. The system according to claim 7, wherein detection of the direction of the electromagnetic radiation at least two antennae or field-intensity measuring sensors that are separate from each other are used.

9. The system according to claim 7, further comprising at least two antennae of the same type, which are affixed to different installation locations of the platform of the aircraft.

10. The system according to claim 7, further comprising means for electronically recording or storing geo-referenced field-intensity mapping.

11. The system according to claim 7, further comprising a display device for showing the relevant electromagnetic field information.

* * * * *